(12) United States Patent
Steffen et al.

(10) Patent No.: US 10,505,553 B1
(45) Date of Patent: Dec. 10, 2019

(54) DETECTING THE HEALTH OF A PHASE LOOP LOCK

(71) Applicant: International Business Machines Corporation, Armonk, NY (US)

(72) Inventors: Christopher W. Steffen, Rochester, MN (US); John P. Borkenhagen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/204,501

(22) Filed: Nov. 29, 2018

(51) Int. Cl.
*H03K 5/14* (2014.01)
*H03L 7/095* (2006.01)
*H03K 19/21* (2006.01)

(52) U.S. Cl.
CPC ............. *H03L 7/095* (2013.01); *H03K 19/21* (2013.01)

(58) Field of Classification Search
CPC combination set(s) only.
See application file for complete search history.

(56) References Cited

U.S. PATENT DOCUMENTS

| | | | |
|---|---|---|---|
| 5,708,382 A * | 1/1998 | Park | G06F 1/10 327/277 |
| 6,320,469 B1 | 11/2001 | Friedberg et al. | |
| 6,794,944 B2 | 9/2004 | Hirai | |
| 6,956,441 B2 | 10/2005 | Matsumaru et al. | |
| 7,120,215 B2 * | 10/2006 | Li | H04L 1/205 375/371 |
| 7,595,672 B2 | 9/2009 | Chen | |
| 7,684,533 B2 | 3/2010 | Eckhardt et al. | |
| 7,944,229 B2 | 5/2011 | Joshi et al. | |
| 8,385,394 B2 | 2/2013 | Kam et al. | |
| 9,804,231 B2 | 10/2017 | Eckert et al. | |
| 10,230,360 B2 * | 3/2019 | Vezyrtzis | H03K 3/0372 |
| 2004/0128591 A1 | 7/2004 | Ihs et al. | |
| 2017/0194971 A1 | 7/2017 | Yonezawa | |
| 2017/0310330 A1 | 10/2017 | Nakajima | |

OTHER PUBLICATIONS

Franch et al., *On-chip Timing Uncertainty Measurements on IBM Microprocessors*, 2008 IEEE International Test Conference, Oct. 2008, pp. 1-7, IEEE Xplore Digital Library (published online Dec. 2008), DOI: 10.1109/TEST.2008.4700707.

* cited by examiner

*Primary Examiner* — An T Luu
(74) *Attorney, Agent, or Firm* — Nathan M. Rau

(57) ABSTRACT

Detecting the health of a phase-lock loop (PLL) generating a feedback clock signal based on a reference clock signal, includes providing, by a delay line, the feedback clock signal to a plurality of latches clocked by the reference clock signal; providing, based on an output of the plurality of latches, an input to a plurality of sticky latches, the input indicating whether an edge of the feedback clock signal was detected; determining, based on a number of asserted sticky latches of the plurality of sticky latches, a phase error metric; comparing the phase error metric to a threshold; and outputting, based on the comparison, an indication of a lock state.

20 Claims, 7 Drawing Sheets

DETECTING THE HEALTH OF A PHASE LOOP LOCK

BACKGROUND

Field of the Invention

The field of the invention is data processing, or, more specifically, methods, apparatus, and products for determining the health of a phase-loop lock (PLL).

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods and apparatus for detecting the health of a phase-lock loop (PLL) generating a feedback clock signal based on a reference clock signal, including providing, by a delay line, the feedback clock signal to a plurality of latches clocked by the reference clock signal; providing, based on an output of the plurality of latches, an input to a plurality of sticky latches, the input indicating whether an edge of the feedback clock signal was detected; determining, based on a number of asserted sticky latches of the plurality of sticky latches, a phase error metric; comparing the phase error metric to a threshold; and outputting, based on the comparison, an indication of a lock state.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
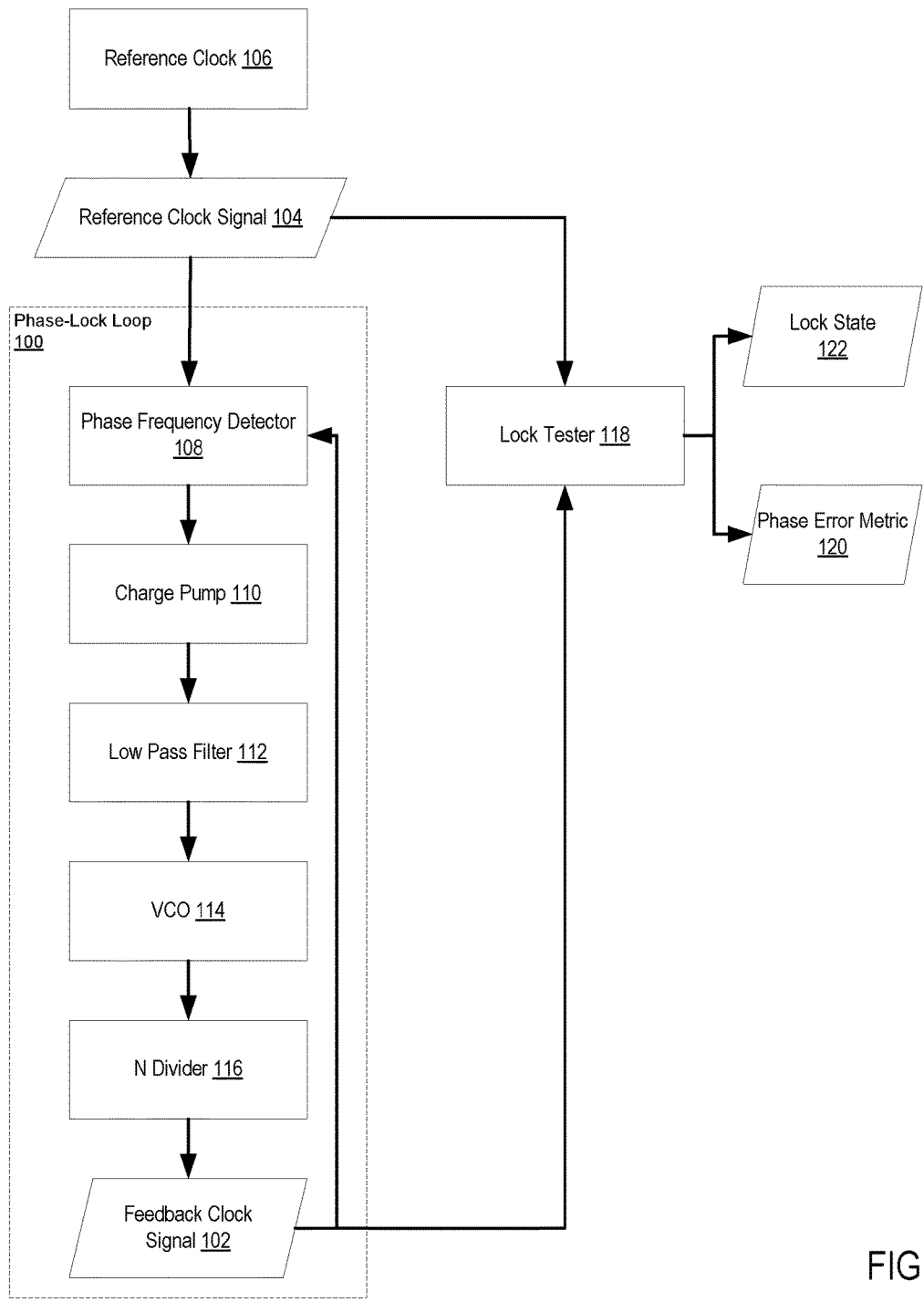
FIG. 1 illustrates an example system for detecting the health of a phase-loop lock.

Exemplary methods, circuits, and apparatus for detecting the health of a phase-loop lock in accordance with the present invention are described with reference to the accompanying drawings, beginning with FIG. 1. FIG. 1 sets forth a network diagram of a system configured for measuring the health of a phase-loop lock 100 according to embodiments of the present invention. The system of FIG. 1 includes a PLL 100. The PLL 100 is configured to generate a feedback clock signal 102 based on a reference clock signal 104 generated by the reference clock 106 that is lower in frequency relative to the feedback clock signal 102.

The PLL 100 may comprise a phase frequency detector 108, a charge pump 110, a low pass filter 112, a voltage controlled oscillator (VCO) 114, and an N divider 116. The phase frequency detector 108 receives as input the reference clock signal 104 and the feedback clock signal 102 produced by the PLL 100. The phase frequency detector 108 compares the phase/frequency of the feedback clock signal 102 and the reference clock signal 104, and generates a voltage signal which represents the difference in phase between the feedback clock signal 102 and the reference clock signal 104. The voltage signal representing the difference in phase between the feedback clock signal 102 and the reference clock signal 104 is fed to a charge pump 110, which converts the voltage signal into current provided to the VCO 114 via the low pass filter 112. The VCO 114 produces the feedback clock signal 102 as driven by the input voltage signal. The feedback clock signal 102 is then looped back to the phase frequency detector 108 via the N divider 116. The N divider 116 is configured such that the frequency of the feedback clock signal 102 divided by N is equal to the frequency of the reference clock signal 106.

Both the feedback lock signal 102 and reference clock signal 104 are provided as input to a lock tester 118. The lock tester 118 is a circuit configured to determine a phase error metric 120 and a lock state 122 and of the PLL 100. The phase error metric 120 is a quantifiable measurement of the phase difference between the feedback clock signal 102 and reference clock signal 104. The lock state 122 describes whether the frequency of the feedback clock signal 102 is "locked" to the reference clock signal 104. As described, the feedback clock signal 102 is considered "locked" to the reference clock signal 104 when the phase error metric 120 falls below a threshold.

Figure 2:
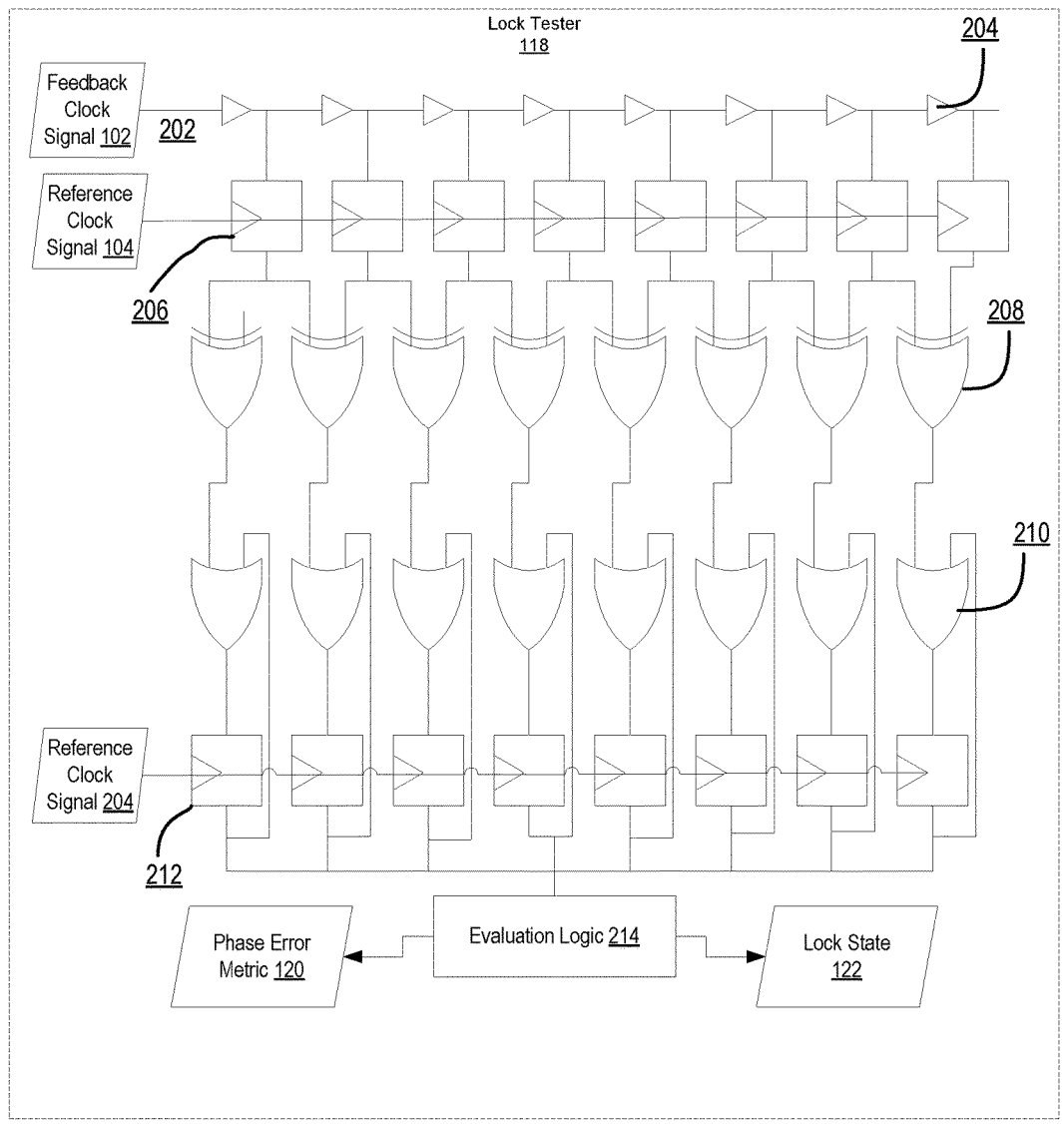
FIG. 2 illustrates an example diagram of a lock tester for detecting the health of a phase-loop lock.

FIG. 2 sets forth a diagram of a lock tester 118 circuit for measuring the health of the PLL 100 by determining the phase error metric 120 and lock state 122 of the PLL 100.

The lock tester 118 includes a delay line 202 carrying the feedback clock signal 102. The delay line 202 includes a plurality of delay elements 204. The delay elements 204 can include, for example, buffers, inverters, logic gates, transmission gates, etc. A plurality of latches 206 clocked by the reference clock signal 104 tap the delay line 202. In this example, the plurality of latches 206 tap the delay line such that the data input for each latch 206 is between two delay elements 204.

Each of the plurality of latches 206 other than the last latch 206 tapping the delay line 202 provides an output to a respective two exclusive OR (XOR) gates 208 of a plurality of XOR gates 208. In this example, the last latch 206 provides output to only one respective XOR gate 208. The output of the XOR gates 208 indicates where an edge of the feedback clock signal 102 occurs. In other words, an output of "1" by an XOR gate 208 indicates an edge transition (e.g., low-to-high, high-to-low) in the feedback clock signal 102 occurring between the two latches 206 that feed the XOR gate 208.

The output of the XOR gates 208 is provided as input to a plurality of OR gates 210. The plurality of OR gates 210 each provide an output to a respective sticky latch 212 of a plurality of sticky latches 212 clocked by the reference clock signal 104. A sticky latch 212 is a latch that, once asserted, remains asserted until a reset signal is provided. Each of the sticky latches 212 provides an output that serves as an input to an OR gate 210. Thus, each OR gate 210 receives, as input, an output from an XOR gate 208 and an output from a sticky latch 212.

The output of the sticky latches 212 is provided as input to evaluation logic 214. The evaluation logic 214 can comprise circuitry, logic gates, programmable logic, or other logic as can be appreciated. The evaluation logic 214 is configured to determine the phase error metric 120 and/or lock state 122 based on the output of the sticky latches 212. Determining the phase error metric 120 and/or lock state 122 based on the output of the sticky latches 212 may comprise determining the phase error metric 120 and/or lock state 122 after running the PLL 100 for a predefined number of cycles. The evaluation logic 214 can determine the phase error metric 120 based on a number of asserted sticky latches 212. Determining the phase error metric 120 based on the number of asserted sticky latches 212 may include determining the phase error metric 120 as the total number of asserted sticky latches 212. Determining the phase error metric 120 based on the number of asserted sticky latches 212 may include determining the phase error metric 120 as a width of the asserted sticky latches 212 (e.g., a maximum number of consecutively asserted sticky latches 212).

Determining the lock state 122 based on the output of the sticky latches 212 may comprise determining the lock state 122 by comparing the phase error metric 120 to a threshold. The lock state 122 indicate the PLL 100 as "locked" when the phase error metric 120 falls below a threshold. The threshold can be a predefined threshold. The threshold can also be a programmatically defined threshold. The evaluation logic 214 can redefine the threshold during runtime of the PLL 100 and the lock tester 118. The evaluation logic 214 can output the phase error metric 120 and/or the lock state 122.

Although FIG. 2 shows the lock tester 118 with a specific number of delay elements 204 and corresponding latches 206, XOR gates 208, OR gates 210, and sticky latches 212, it is understood that this serves as an example and that any number of delay elements 204 can be used, thereby also requiring a corresponding number of corresponding latches 206, XOR gates 208, OR gates 210, and sticky latches 212. The number of delay elements 212 can be determined based on the feedback clock signal 102. For example, the number of delay elements 212 can be set such that the delay line captures a full period of the feedback clock signal 102.

Figure 3:
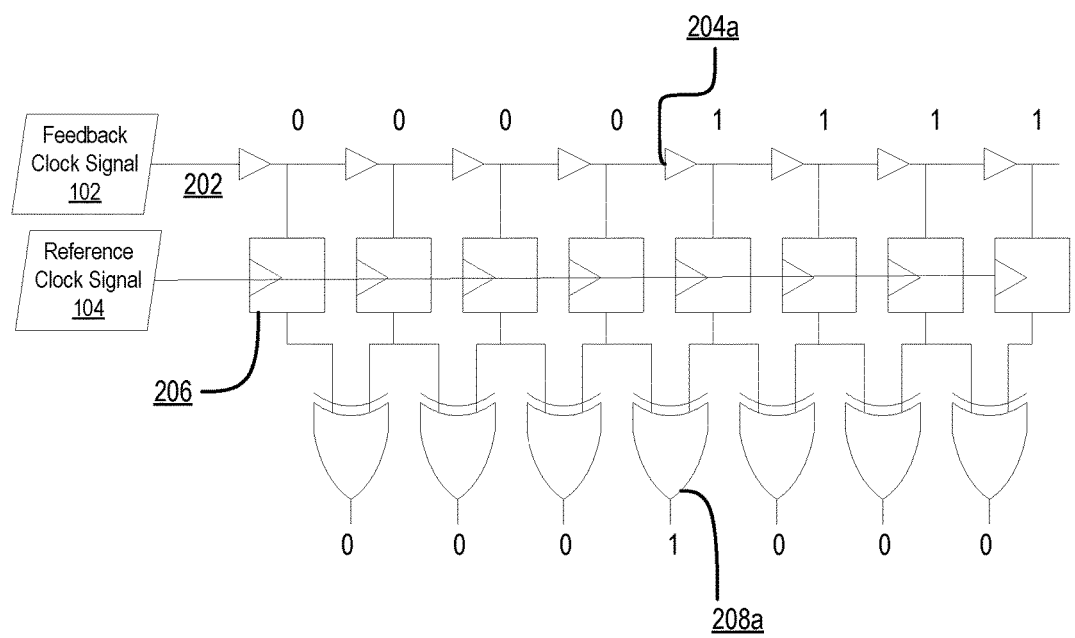
FIG. 3 illustrates how a switch in a feedback clock signal can be determined.

FIG. 3 shows how the delay line 202, latches 206 clocked by the reference clock signal 104, and XOR gates 208 function to indicate a switch in the feedback clock signal 102. In this example, the feedback clock signal 102 has a "low" state prior to the delay element 204a, indicated by a "0." The feedback clock signal 102 has a "high" state after to the delay element 208a), indicated by a "1." The output of the respective latches 206 are provided as input to the XOR gates 208 such that the output of the XOR gate 208a) is a "1," indicating the transition from "low" to "high."

Figure 4:
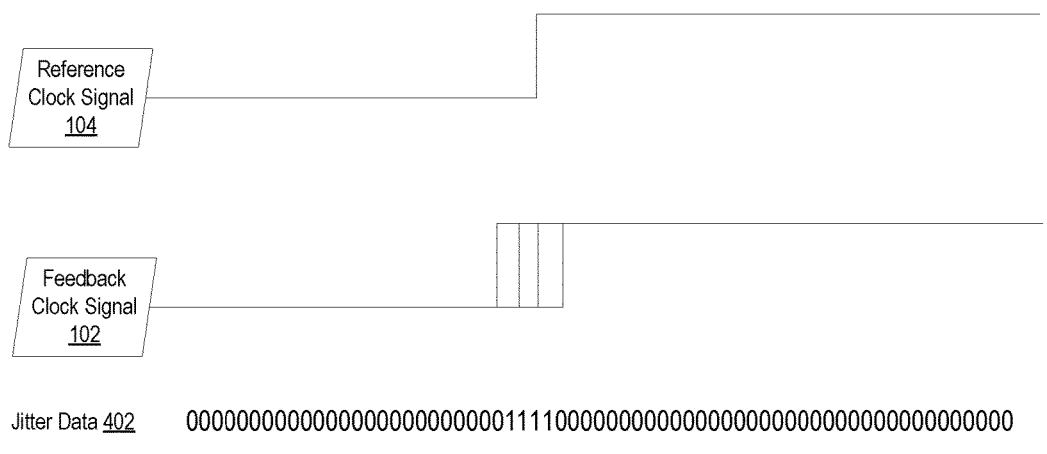
FIG. 4 illustrates how jitter data can express a phase difference between a reference clock signal and a feedback clock signal

FIG. 4 shows an example depiction of how jitter in the feedback clock signal 102 can be expressed as jitter data 402. Here, the feedback clock signal 102 experiences jitter over several clock cycles due to a phase variance from the reference clock signal 104. Each instance of jitter is encoded as a "1,", while a "0" indicates that the reference clock signal 104 and feedback clock signal 102 are in phase.

Figure 5:
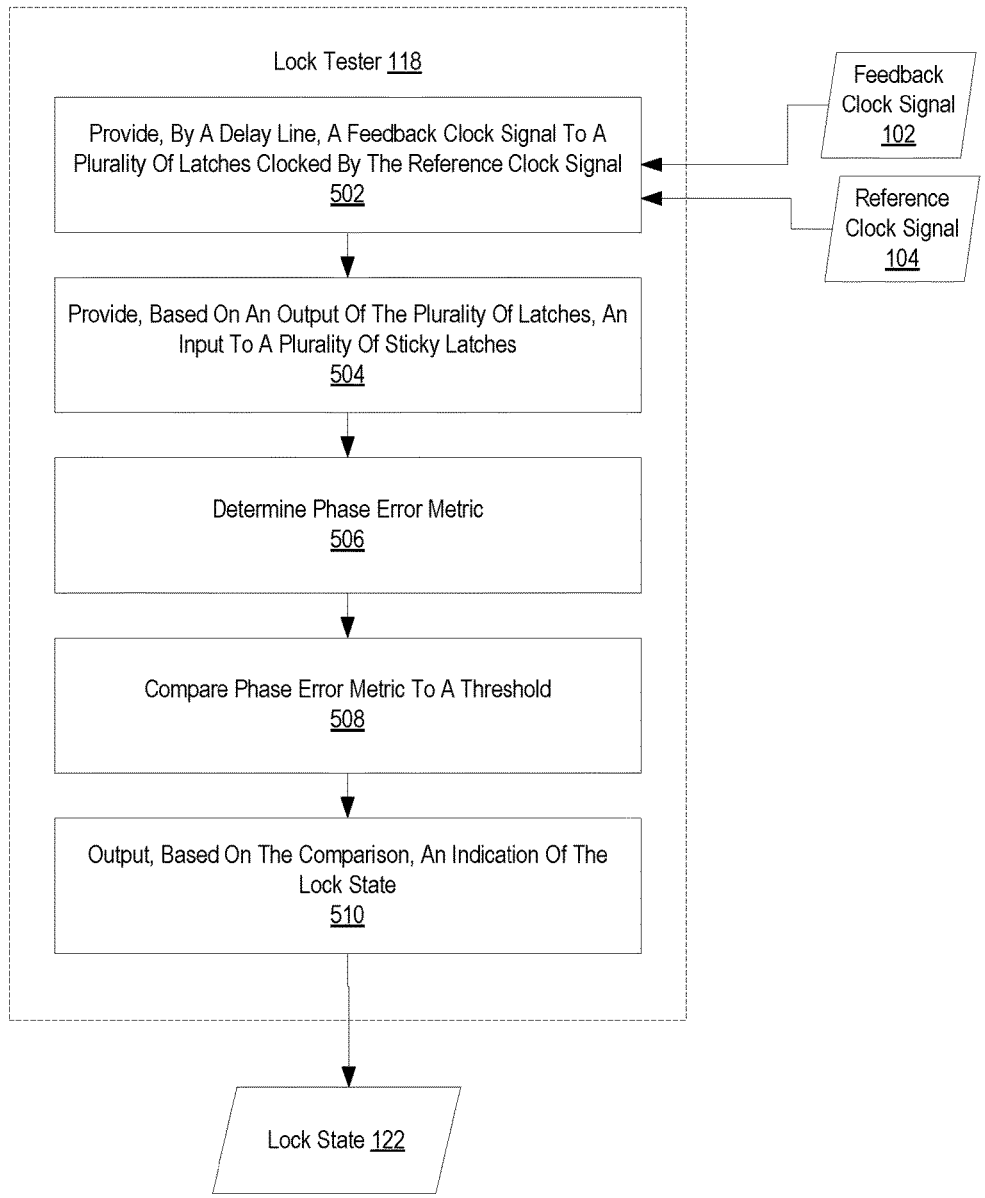
FIG. 5 illustrates a flowchart of an example method for detecting the health of a phase loop lock.

For further explanation, FIG. 5 sets forth a flow chart illustrating an exemplary method for measuring the lock health of a PLL 100 according to embodiments of the present invention that includes providing 502, by a delay line 202 a feedback clock signal 102 to a plurality of latches 206 clocked by a reference clock signal 104. Proving 502, by a delay line 202 a feedback clock signal 102 to a plurality of latches 206 clocked by a reference clock signal 104 can include proving 502, by a delay line 202 a feedback clock signal 102 to a plurality of latches 206 clocked by a reference clock signal 104, wherein each latch 206 of the plurality of latches 206 taps the delay line 202 between two delay elements 204.

The method of FIG. 5 may also include providing 504, based on an output of the plurality of latches 206, an input to a plurality of sticky latches 212. Providing 504, based on an output of the plurality of latches 206, an input to a plurality of sticky latches 212 may include providing the output of the plurality of latches 206 to a plurality of XOR gates 208, and providing the output of each of the plurality of XOR gates 208 to a corresponding sticky latch of the plurality of sticky latches 212.

The method of FIG. 5 may also include determining 506 a phase error metric 120. Determining the phase error metric 120 can be performed by evaluation logic 214 of the lock tester 118. Determining the phase error metric 120 may comprise determining the phase error metric 120 based on a number of asserted sticky latches 212. For example, determining the phase error metric 120 based on a number of asserted sticky latches 212 may comprise determining the phase error metric 120 as a number of asserted sticky latches 212. For example, determining the phase error metric 120 based on a number of asserted sticky latches 212 may comprise determining the phase error metric 120 as a maximum number of consecutively asserted sticky latches 212.

The method of FIG. 5 may also include comparing 508 the phase error metric to a threshold. Comparing the phase error metric 120 to a threshold may be performed by evaluation logic 214 of the lock tester 118. The method of FIG. 5 may also include outputting 510, based on the comparison, and indication of the lock state 122. Outputting, based on the comparison, an indication of the lock state 122 may include outputting an indication that the PLL 100 is in a "locked" state when the phase error metric 120 falls below the threshold. Outputting, based on the comparison, an indication of the lock state 122 may include outputting an indication that the PLL 100 is in an "unlocked" state when the phase error metric 120 meets the threshold.

Figure 6:
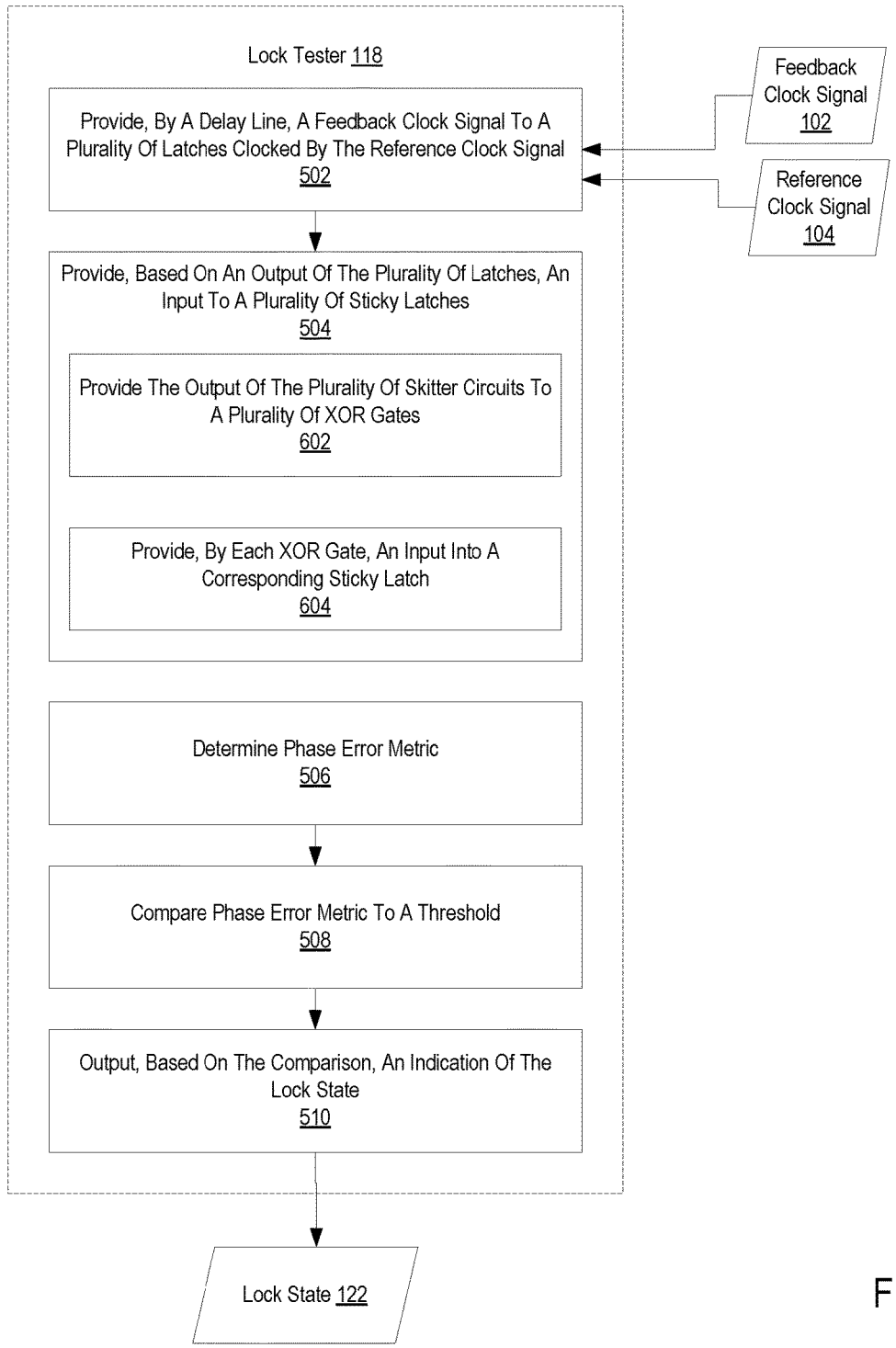
FIG. 6 illustrates a flowchart of an example method for detecting the health of a phase loop lock.

For further explanation, FIG. 6 sets forth a flow chart illustrating an exemplary method for measuring the lock health of a PLL 100 according to embodiments of the present invention that includes providing 502, by a delay line 202, a feedback clock signal 102 to a plurality of latches 206 clocked by a reference clock signal 104, providing 504, based on an output of the plurality of latches 206, an input to a plurality of sticky latches 212, determining 506 a phase error metric 120, comparing 508 the phase error metric 120 to a threshold, and outputting 510, based on the comparison, an indication of the lock state 122. FIG. 6 differs from FIG.

5 in that providing 504, based on an output of the plurality of latches 206, an input to a plurality of sticky latches 212 comprises providing 602 the output of the plurality of latches 206 to a plurality of XOR gates 208.

Providing 602 the output of the plurality of latches 206 to a plurality of XOR gates 212 can comprise providing, by each latch 206, an output into two XOR gates 212. FIG. 6 further differs from FIG. 5 in that providing 504, based on an output of the plurality of latches 206, an input to a plurality of sticky latches 212 comprises providing 604, by each XOR gate 208, an input into a corresponding sticky latch 212. Providing 604, by each XOR gate 208, an input into a corresponding sticky latch 212 can comprise providing, by each XOR gate 208 an input into a corresponding OR gate 210 and providing, by each OR gate 210, an input into the corresponding sticky latch 212. Each OR gate 210 may have a first input from a corresponding XOR gate 208 and the output of the respective OR gate 210 fed back as a second input.

Figure 7:
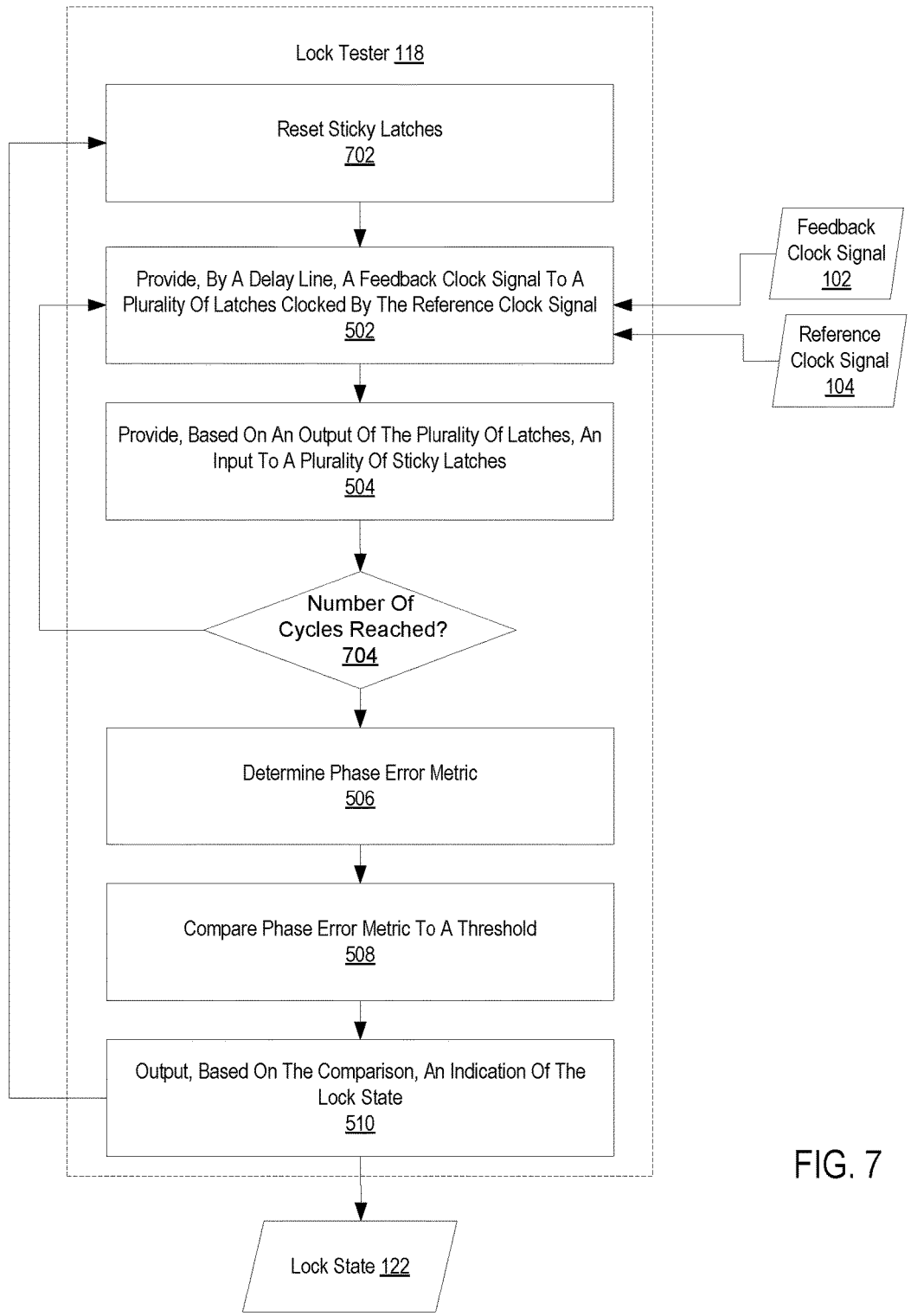
FIG. 7 illustrates a flowchart of an example method for detecting the health of a phase loop lock.

For further explanation, FIG. 7 sets forth a flow chart illustrating an exemplary method for measuring the lock health of a PLL 100 according to embodiments of the present invention that includes providing 502, by a delay line 202, a feedback clock signal 102 to a plurality of latches 206 clocked by a reference clock signal 104, providing 504, based on an output of the plurality of latches 206, an input to a plurality of sticky latches 212, determining 506 a phase error metric 120, comparing 508 the phase error metric 120 to a threshold, and outputting 510, based on the comparison, an indication of the lock state 122.

FIG. 7 differs from FIG. 5 in that providing 504, based on an output of the plurality of latches 206, an input to a plurality of sticky latches 212 comprises providing 602 the output of the plurality of latches 206 to a plurality of XOR gates 208. Providing 602 the output of the plurality of latches 206 to a plurality of XOR gates 208 can comprise providing, by each latch 206, an output into two XOR gates 208. FIG. 7 differs from FIG. 5 in that the method begins with resetting 702 the plurality of sticky latches 212 such that any asserted sticky latch 212 is returned to an unasserted state. FIG. 7 further differs from FIG. 5 in that, before determining 506 the phase error metric 120, it is determined 704 whether a number of cycles performed by the PLL 100 has been reached. If not, the method returns to the providing 502, and repeats the providing 502 and providing 504 until the number of cycles has been reached. Thus, the determined 506 phase error metric 120 reflects the phase error accumulated over multiple clock cycles.

In view of the explanations set forth above, readers will recognize that the benefits of determining the health of a PLL according to embodiments of the present invention include:
 Providing for a single block to detect both phase error and a lock state of a PLL, as opposed to existing solutions that determine the phase error and lock state using separate dedicated blocks.
 Utilizing the phase error as a metric for determining the lock state of a PLL.

Embodiments of the present invention can take the form of a circuit. The circuit may be incorporated into a circuit library and may be incorporated into a chip design. In this way, PLLs 100 may be monitored and measured to provide information on operational functions and output directly from the chip being tested or measured.

Embodiments of the present invention can take the form of an entirely hardware embodiment, an entirely software embodiment or an embodiment including both hardware and software elements. In a preferred embodiment, the present invention is implemented in hardware; however, software elements and software embodiments may be employed. The software may include but is not limited to firmware, resident software, microcode, etc.

Circuits as described herein may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The present invention may be an apparatus, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of detecting the health of a phase-lock loop (PLL) generating a feedback clock signal based on a reference clock signal, the method comprising:
   providing, by a delay line, the feedback clock signal to a plurality of latches clocked by the reference clock signal;
   providing, based on an output of the plurality of latches, an input to a plurality of sticky latches, the input indicating whether an edge of the feedback clock signal was detected;
   determining, based on a number of asserted sticky latches of the plurality of sticky latches, a phase error metric;
   comparing the phase error metric to a threshold; and
   outputting, based on the comparison, an indication of a lock state.

2. The method of claim 1, wherein providing the feedback clock signal and providing the input to the plurality of sticky latches is repeated for a predefined number of cycles of the feedback clock signal, and wherein determining the phase error metric is performed after the predefined number of cycles of the feedback clock signal.

3. The method of claim 1, wherein providing the input to a plurality of sticky latches comprises:
   providing the output of the plurality of latches to a plurality of exclusive OR (XOR) gates, wherein each XOR gate of the plurality of XOR gates receives a signal from two latches of the plurality of latches; and
   providing, by each XOR gate of the plurality of XOR gates, an output into a corresponding sticky latch of the plurality of sticky latches.

4. The method of claim 3, wherein providing, by each XOR gate of the plurality of XOR gates into a corresponding sticky latch of the plurality of sticky latches comprises:
   providing, by each XOR gate of the plurality of XOR gates, the output into a corresponding OR gate of a plurality of OR gates; and
   providing, by each OR gate of the plurality of OR gates, an output into the corresponding sticky latch of the plurality of sticky latches, wherein each OR gate of the plurality of OR gates accepts, as input, an output from the corresponding sticky latch of the plurality of sticky latches.

5. The method of claim 1, wherein outputting, based on the comparison, the indication of the lock state comprises:
   outputting, based on the comparison falling below the threshold, and indication of a locked state; and
   outputting, based on the comparison satisfying the threshold, an indication of an unlocked state.

6. The method of claim 1, further comprising resetting the plurality of sticky latches.

7. The method of claim 1, wherein each latch of the plurality of latches taps the delay line such that an input for each latch of the plurality of latches is connected between two delay elements.

8. A circuit for detecting the health of a phase-lock loop (PLL) generating a feedback clock signal based on a reference clock signal, the circuit configured to carry out the steps of:
   providing, by a delay line, the feedback clock signal to a plurality of latches clocked by the reference clock signal;
   providing, based on an output of the plurality of latches, an input to a plurality of sticky latches, the input indicating whether an edge of the feedback clock signal was detected;
   determining, based on a number of asserted sticky latches of the plurality of sticky latches, a phase error metric;
   comparing the phase error metric to a threshold; and
   outputting, based on the comparison, an indication of a lock state.

9. The circuit of claim 8, wherein providing the feedback clock signal and providing the input to the plurality of sticky latches is repeated for a predefined number of cycles of the feedback clock signal, and wherein determining the phase error metric is performed after the predefined number of cycles of the feedback clock signal.

10. The circuit of claim 8, wherein providing the input to a plurality of sticky latches comprises:
    providing the output of the plurality of latches to a plurality of exclusive OR (XOR) gates, wherein each XOR gate of the plurality of XOR gates receives a signal from two latches of the plurality of latches; and
    providing, by each XOR gate of the plurality of XOR gates, an output into a corresponding sticky latch of the plurality of sticky latches.

11. The circuit of claim 10, wherein providing, by each XOR gate of the plurality of XOR gates into a corresponding sticky latch of the plurality of sticky latches comprises:
    providing, by each XOR gate of the plurality of XOR gates, the output into a corresponding OR gate of a plurality of OR gates; and
    providing, by each OR gate of the plurality of OR gates, an output into the corresponding sticky latch of the plurality of sticky latches, wherein each OR gate of the plurality of OR gates accepts, as input, an output from the corresponding sticky latch of the plurality of sticky latches.

12. The circuit of claim 8, wherein outputting, based on the comparison, the indication of the lock state comprises:
    outputting, based on the comparison falling below the threshold, and indication of a locked state; and
    outputting, based on the comparison satisfying the threshold, an indication of an unlocked state.

13. The circuit of claim 8, wherein the method further comprises resetting the plurality of sticky latches.

14. The circuit of claim 8, wherein each latch of the plurality of latches taps the delay line such that an input for each latch of the plurality of latches is connected between two delay elements.

15. An apparatus comprising a circuit for detecting the health of a phase-lock loop (PLL) generating a feedback clock signal based on a reference clock signal, the circuit configured to carry out the steps of:
    providing, by a delay line, the feedback clock signal to a plurality of latches clocked by the reference clock signal;
    providing, based on an output of the plurality of latches, an input to a plurality of sticky latches, the input indicating whether an edge of the feedback clock signal was detected;
    determining, based on a number of asserted sticky latches of the plurality of sticky latches, a phase error metric;
    comparing the phase error metric to a threshold; and
    outputting, based on the comparison, an indication of a lock state.

16. The apparatus of claim 15, wherein providing the feedback clock signal and providing the input to the plurality of sticky latches is repeated for a predefined number of cycles of the feedback clock signal, and wherein determining the phase error metric is performed after the predefined number of cycles of the feedback clock signal.

17. The apparatus of claim 15, wherein providing the input to a plurality of sticky latches comprises:
    providing the output of the plurality of latches to a plurality of exclusive OR (XOR) gates, wherein each XOR gate of the plurality of XOR gates receives a signal from two latches of the plurality of latches; and
    providing, by each XOR gate of the plurality of XOR gates, an output into a corresponding sticky latch of the plurality of sticky latches.

18. The apparatus of claim 17, wherein providing, by each XOR gate of the plurality of XOR gates into a corresponding sticky latch of the plurality of sticky latches comprises:
    providing, by each XOR gate of the plurality of XOR gates, the output into a corresponding OR gate of a plurality of OR gates; and
    providing, by each OR gate of the plurality of OR gates, an output into the corresponding sticky latch of the plurality of sticky latches, wherein each OR gate of the plurality of OR gates accepts, as input, an output from the corresponding sticky latch of the plurality of sticky latches.

19. The apparatus of claim 15, wherein outputting, based on the comparison, the indication of the lock state comprises:
    outputting, based on the comparison falling below the threshold, and indication of a locked state; and
    outputting, based on the comparison satisfying the threshold, an indication of an unlocked state.

20. The apparatus of claim 15, wherein the method further comprises resetting the plurality of sticky latches.

* * * * *